(12) United States Patent
Pavao Moreira et al.

(10) Patent No.: US 10,103,740 B2
(45) Date of Patent: Oct. 16, 2018

(54) METHOD AND APPARATUS FOR CALIBRATING A DIGITALLY CONTROLLED OSCILLATOR

(71) Applicant: FREESCALE SEMICONDUCTOR, INC., Austin, TX (US)

(72) Inventors: Cristian Pavao Moreira, Frouzins (FR); Olivier Vincent Doare, La Salvetat St Gilles (FR); Birama Goumballa, Larra (FR); Didier Salle, Toulouse (FR)

(73) Assignee: NXP USA, Inc., Austin, TX (US)

( * ) Notice: Subject to any disclaimer, the term of this patent is extended or adjusted under 35 U.S.C. 154(b) by 140 days.

(21) Appl. No.: 15/340,513

(22) Filed: Nov. 1, 2016

(65) Prior Publication Data

US 2017/0126237 A1    May 4, 2017

(30) Foreign Application Priority Data

Nov. 2, 2015 (WO) .................. PCT/IB2015/002434

(51) Int. Cl.
*H03B 5/08*    (2006.01)
*H03L 7/099*   (2006.01)
(Continued)

(52) U.S. Cl.
CPC ............. *H03L 7/0991* (2013.01); *H03B 5/04* (2013.01); *H03B 5/1212* (2013.01);
(Continued)

(58) Field of Classification Search
CPC .. H03B 5/1228; H03B 5/1253; H03B 5/1212; H03B 5/1221; H03B 5/12; H03B 5/04;
(Continued)

(56) References Cited

U.S. PATENT DOCUMENTS

| 5,648,744 A | 7/1997 | Prakash et al. |
| 7,474,167 B1 * | 1/2009 | Zhuang ..................... H03J 3/20 331/177 V |

(Continued)

*Primary Examiner* — Arnold Kinkead

(57) ABSTRACT

A method of calibrating a digitally controlled oscillator (DCO). The method comprises configuring a fine tuning capacitive component of the DCO into a minimum capacitance configuration therefor, configuring a coarse tuning capacitive component of the DCO into a first configuration therefor and determining a resulting first output frequency of the DCO. The method further comprises configuring the coarse tuning capacitive component into a second configuration therefor, the second and first configurations of the coarse tuning capacitive component being capacitively increasing consecutive configurations respectively, configuring the fine tuning capacitive component into a maximum capacitance configuration therefor, determining control signal settings for a resolution adjustment component of the DCO that achieve a resulting output frequency of the DCO equal to the determined first output frequency, and generating calibration data for the second configuration of the coarse tuning capacitive component comprising the determined control signal settings for the resolution adjustment component.

11 Claims, 7 Drawing Sheets

(51) Int. Cl.
  *H03L 7/093* (2006.01)
  *H03L 7/091* (2006.01)
  *H03L 7/18* (2006.01)
  *H03B 5/04* (2006.01)
  *H03B 5/12* (2006.01)
  *H03L 7/12* (2006.01)

(52) U.S. Cl.
  CPC ......... *H03B 5/1228* (2013.01); *H03B 5/1253* (2013.01); *H03B 5/1265* (2013.01); *H03L 7/091* (2013.01); *H03L 7/093* (2013.01); *H03L 7/099* (2013.01); *H03L 7/12* (2013.01); *H03L 7/18* (2013.01); *H03B 2201/0208* (2013.01)

(58) Field of Classification Search
  CPC ....... H03B 5/1265; H03L 7/099; H03L 7/093; H03L 7/12; H03L 7/104; H03L 7/0991; H03L 7/18; H03L 7/091; G01S 7/35
  USPC .... 331/177 R, 34, 167, 177 V, 36 C, 117 FE
  See application file for complete search history.

(56) References Cited

U.S. PATENT DOCUMENTS

| | | |
|---|---|---|
| 9,379,721 B2 | 6/2016 | Pavao-Moreira et al. |
| 2002/0033741 A1 | 3/2002 | Craninckx et al. |
| 2012/0249195 A1* | 10/2012 | Guo ........................ H03L 7/103 327/156 |
| 2014/0035691 A1 | 2/2014 | Lamanna et al. |
| 2017/0194973 A1* | 7/2017 | Moehlmann .............. G01S 7/35 |

* cited by examiner

| | $C_{coarse}$ | $C_{fine}$ | $C_{res}$ | Frequency |
|---|---|---|---|---|
| 1310 | 0 | 0 | Default | ... |
| | 1 | 0 | Default | ... |
| | M | 0 | Default | ... |
| 1320 | 0 | n | Tuned | ... |
| | 1 | n | Tuned | ... |
| | M | n | Tuned | ... |

| DCO Digital Control Word | $C_{fine}$ Config. | $C_{coarse}$ Config. | $C_{res}$ Config. | Frequency |
|---|---|---|---|---|
| | | | | |
| | | | | |
| | | | | |
| | | | | |
| | | | | |
| | | | | |
| | | | | |
| | | | | |

METHOD AND APPARATUS FOR CALIBRATING A DIGITALLY CONTROLLED OSCILLATOR

FIELD OF THE INVENTION

This invention relates to a method and apparatus for calibrating a digitally controlled oscillator.

BACKGROUND OF THE INVENTION

In many applications, a digital synthesizer is implemented by way of a digital phase locked loop (DPLL) that is used to control a digitally controlled oscillator (DCO) to generate (synthesize) an output frequency signal. Such digital synthesizers provide the benefit of simplifying the integration of the synthesizer circuitry within large scale integrated digital circuit devices, as compared with equivalent analogue synthesizers, thereby reducing size, costs, power consumption and design complexity. Furthermore, DPLLs intrinsically present lower phase noise than their analogue counterparts.

In applications such as automotive radar systems, phase noise introduced into the output frequency signal by the synthesizer is critical. In the case of radar systems, the phase noise dictates the system's ability to distinguish between small and large targets (i.e. the dynamic range of the radar system). Accordingly, for such applications it is important to minimize the phase noise introduced by the digital synthesizers (e.g. DPLLs), and specifically their DCOs, as well as to linearize the FMCW (frequency modulated continuous wave) ramp in the case of a FMCW system.

SUMMARY OF THE INVENTION

The present invention provides a method of calibrating a digitally controlled oscillator, a digital synthesizer comprising a digitally controlled oscillator and a digitally controlled oscillator as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

In accordance with some example embodiments of the present invention, there is provided a method of calibrating a digitally controlled oscillator (DCO). More specifically, during calibration of the DCO, it is proposed to calibrate, for each coarse tuning capacitive configuration, a resolution adjustment component of the fine tuning capacitive component of the DCO such that the fine tuneable ranges for consecutive coarse tuning capacitive bank configurations are aligned.

Advantageously, such a calibration process allows PVT variations etc. to be compensated for without the need for relying on error margins that waste control signals/codes for the fine tuning capacitive component. In particular, following such a calibration process, the full fine tuneable range of the DCO is used, and no control signals/codes are wasted on error margins. Consequently, the smallest achievable DCO LSB tuneable frequency step can be realized, and thus the minimum achievable frequency resolution of the DCO can be realized. In this manner, the quantization noise introduced by the DCO may be minimized, thereby improving the phase noise performance of a DPLL of which the DCO forms a part. Furthermore, fine tuning capacitive component transitions can be aligned between consecutive coarse tuning capacitive bank configurations, thereby improving the linearity of the transitions between the coarse tuning capacitive bank configurations.

Figure 1:
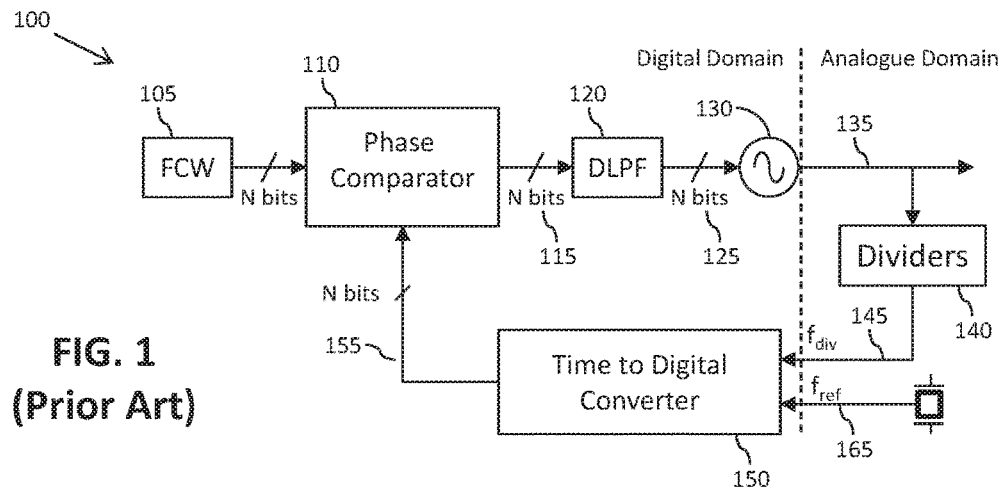
FIG. 1 illustrates a conventional digital phase locked loop.

FIG. 1 illustrates a conventional digital phase locked loop (DPLL) 100. An N-bit digital frequency control word 105 is provided to a phase comparator 110, which compares an N-bit digital feedback signal 155 to the frequency control word 105, and outputs an N-bit oscillator control signal 115 based on the comparison of the digital feedback signal 155 to the frequency control word 105. A digital low pass filter 120 filters the oscillator control signal 115, and outputs a filtered N-bit oscillator control signal 125, which is provided to a digitally controlled oscillator (DCO) 130. The DCO 130 outputs a frequency signal 135 based on the filtered oscillator control signal 125. A feedback path of the DPLL 100 consists of a divider 140 that divides the output frequency signal 135 to generate a frequency-divided signal 145, which is provided to a time to digital converter 150. The time to digital converter 150 also receives a reference frequency signal 165 used to sample the frequency-divided signal 145. The time to digital converter 150 outputs the digital feedback signal 155 based on a measured time interval between the frequency-divided signal 145 and the reference frequency signal 165.

The phase noise introduced by the DPLL 100 of FIG. 1 is primarily due to the digital-to-analogue conversion performed by the DCO 130, and time-to-digital conversion performed by the time to digital converter 150 in the feedback path. In particular, the minimum frequency resolution of the DCO 130 dictates the phase noise performance of the DPLL 100, since it introduces quantization noise on top of the intrinsic DCO noise performance. The minimum DCO frequency resolution ($f_{res}$) is selectable during the design phase of the DPLL, and represents the DCO LSB (least significant bit) tuneable frequency step (i.e. the granularity of the tuning capacitance codeword).

Figure 2:
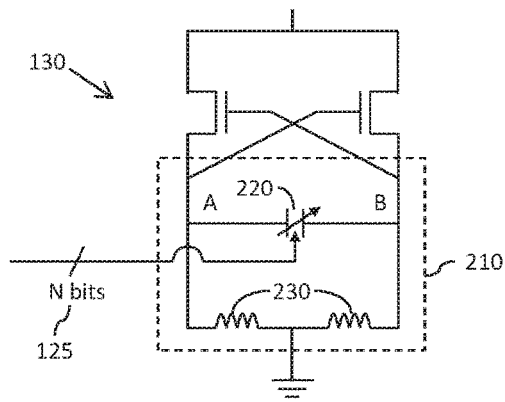
FIG. 2 illustrates a simplified circuit diagram of a digitally controlled oscillator.

FIG. 2 illustrates a simplified circuit diagram of a typical DCO 130. The DCO 130 includes an LC (inductance-capacitance) tank circuit 210 arranged to oscillate a current at a resonant frequency of the LC tank circuit 210. As is typical with such LC tank circuits, the LC tank circuit 210 of FIG. 2 includes various passive elements in the form of inductive and capacitive elements. For simplicity, the LC tank circuit 210 of FIG. 2 is illustrated as comprising a variable capacitance component 220 and inductive elements 230 coupled in parallel with the variable capacitance component 220 between two tank nodes A and B. However, any suitable arrangement of inductive and capacitive elements may be provided within the LC tank circuit 210. The capacitive properties of the variable capacitance component 220 may be 'tuned' by way of the N-bit digital control signal 125, output by the digital low-pass filter 120 in FIG. 1, and in this manner the resonant frequency of the LC tank circuit 210 may be controlled.

Figure 3:
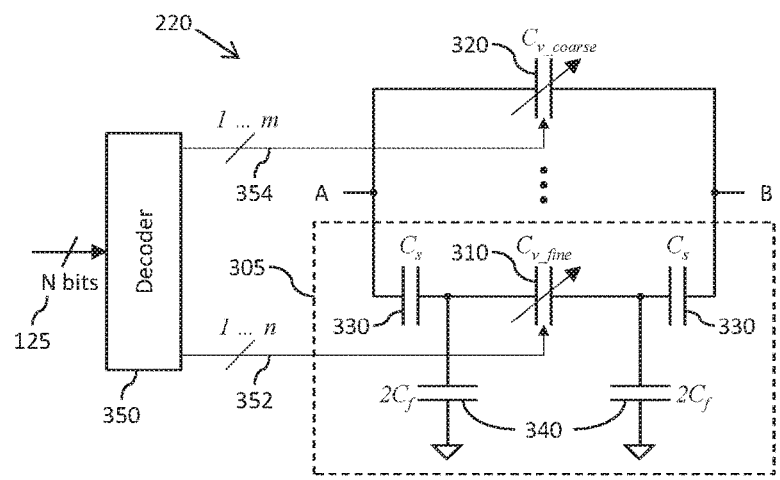
FIG. 3 illustrates a simplified circuit diagram of a conventional digitally controlled variable capacitance component of a digitally controlled oscillator.

FIG. 3 illustrates a simplified circuit diagram of a conventional digitally controlled variable capacitance component 220. The variable capacitance component 220 consists of several capacitive banks coupled in parallel, between the tank nodes A and B, to provide the required DCO frequency range and tuning resolution. In the implementation illustrated in FIG. 3, the variable capacitance component 220 includes a fine tuning capacitive bank 310 and one or more coarse tuning capacitive banks, illustrated generally at 320.

A decoder 350 is arranged to receive and decode the N-bit oscillator control signal 125, and to output control signals 352, 354 to each of the capacitive banks 310, 320 in accordance with the decoded N-bit oscillator control signal 125. In the illustrated implementation of FIG. 3, the decoder 350 outputs n+m control signals 352, 354; n of the control signals 352 controlling capacitive elements (not illustrated) within the fine tuning capacitive bank 310; and m of the control signal 354 controlling capacitive elements (not illustrated) within the coarser tuning capacitive bank(s) 320.

The fine tuning capacitive bank 310 is coupled in series with two series capacitances $C_s$ 330. The fine tuning capacitance bank 310 is further coupled on either side thereof to a reference voltage (ground in the illustrated implementation) by two shunt capacitances $2C_f$ 340. The fine tuning capacitive bank 310, series capacitances $C_s$ 330 and shunt capacitances $2C_f$ 340 together form a fine tuning capacitive network 305 of the variable capacitance component 220. The capacitive change step size ($\Delta C_v$) of the fine tuning capacitive bank 310 defines the minimum frequency resolution for the DCO 130, and thus the quantization noise for the DCO 130. The capacitances $C_s$ 330 and $2C_f$ 340 reduce the capacitive contribution of the fine tuning capacitance bank 310 within the overall effective capacitance of the variable capacitance component 220. Specifically, the equivalent capacitance $C_{eq}$ of the fine tuning capacitive network 305 may be expressed as:

$$C_{eq} = \frac{C_s(C_v + C_f)}{2(C_v + C_f) + C_s} \qquad \text{Equation 1}$$

From Equation 1, it can be seen that a change in the capacitance $\Delta C_v$ of the fine tuning capacitance bank 310 results in a change in the equivalent capacitance $\Delta C_{eq}$ of:

$$\Delta C_{eq} = \frac{C_s^2}{2(C_v + C_f + C_s)^2} \times \Delta C_v \qquad \text{Equation 2}$$

In this manner, a finer minimum equivalent capacitive resolution ($\Delta C_{eq}$) for the fine tuning capacitive network 305, and thus for the variable capacitance component 220, may be achieved with the capacitances $C_s$ 330 and $2C_f$ 340 than would otherwise be directly achievable through configuration of the fine tuning capacitive bank 310 alone (i.e. that of $\Delta C_v$).

Figure 4:
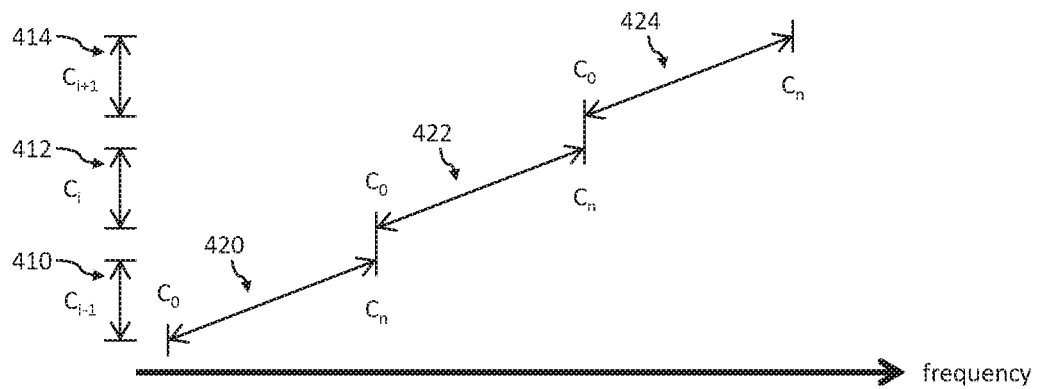
FIG. 4 illustrates an ideal relationship between the configuration of capacitive banks of the digitally controlled oscillator of FIG. 3 and the resulting output frequency of the digitally controlled oscillator.

FIG. 4 illustrates an ideal relationship between the configuration of the capacitive banks 310, 320 and the resulting output frequency of the DCO 130. Three consecutive coarse tuning capacitive bank configurations are illustrated at $C_{i-1}$ 410, $C_i$ 412 and $C_{i+1}$ 414 respectively. The tuneable range of the fine tuning capacitive network 305 for each of the coarse tuning capacitive bank configurations $C_{i-1}$ 410, $C_i$ 412 and $C_{i+1}$ 414 is illustrated at 420, 422 and 424 respectively. In an ideal scenario, such as illustrated in FIG. 4, the tuneable ranges 420, 422 and 424 of the fine tuning capacitive network 305 for consecutive coarse tuning capacitive bank configurations are aligned. However, PVT (Process, voltage, temperature) variations etc. mean that it is not possible to ensure such alignment of the tuneable ranges 420, 422 and 424 of the fine tuning capacitive network 305 for consecutive coarse tuning capacitive bank configurations.

Figure 5:
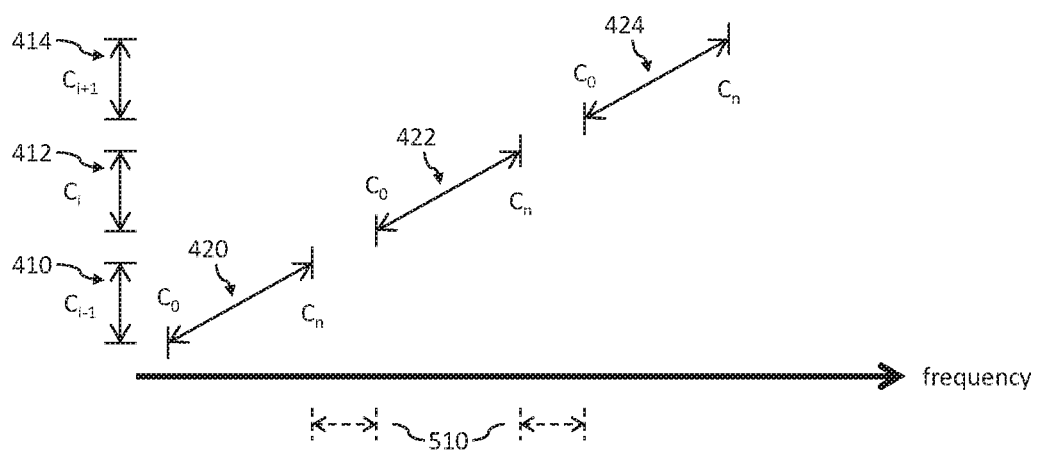
FIG. 5 illustrates a scenario in which the tuneable ranges of a fine tuning capacitive network of the digitally controlled oscillator of FIG. 3 for consecutive coarse tuning capacitive configurations do not align.

FIG. 5 illustrates a scenario in which the tuneable ranges 420, 422 and 424 of the fine tuning capacitive network 305 for consecutive coarse tuning capacitive bank configurations do not align. In the scenario illustrated in FIG. 5, the tuneable ranges 420, 422 and 424 of the fine tuning capacitive network 305 are not aligned, and do not overlap. As a result, gaps 510 occur within the achievable output frequency range of the DCO 130, resulting in an inability of the DCO 130 to generate certain frequency signals.

Figure 6:
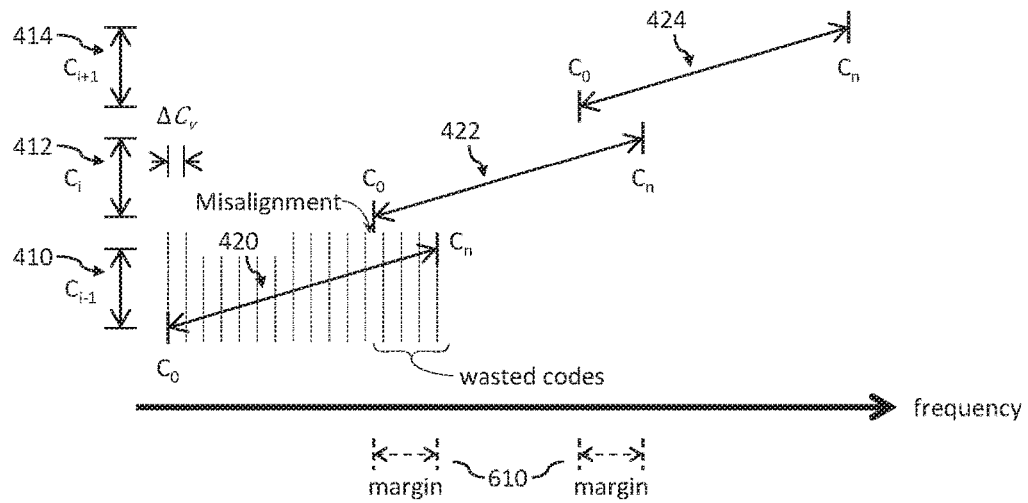
FIG. 6 illustrates a conventional technique for compensating for PVT variations etc. within the digitally controlled oscillator of FIG. 3.

FIG. 6 illustrates a conventional technique for compensating for PVT variations etc. in order to ensure a continuous achievable output frequency range for the DCO 130. For the conventional technique, the tuneable ranges 420, 422 and 424 of the fine tuning capacitive network 305 for consecutive coarse tuning capacitive bank configurations are designed to overlap by an error margin 610. In this manner, PVT variations that would otherwise result in gaps occurring within the achievable output frequency range of the DCO 130 can be tolerated by being compensated for within the error margins 610.

However, in order to ensure a sufficiently high yield of fabricated devices, the error margins 610 must be sufficient to compensate for (close to) worst-case PVT variations. Consequently, in the majority of cases, the implemented error margins 610 will over-compensate. The tuneable range of the fine tuning capacitive network 305 is controlled through a finite number (n in FIG. 3) of control signals/codes 352 that tune the fine tuning capacitive bank 310. In order to implement the error margin 610, the tuneable range of the fine tuning capacitive network 305 must be extended to include the error margin 610. As a result, the finite number n of control signals/codes 352 available for controlling the tuneable range of the fine tuning capacitive network 305 are required to cover an extended tuneable range that includes the error margin 610, increasing the fine tuning capacitive change step size ($\Delta C_{eq}$) of each control signal/code 352. Following calibration of the DCO 130, the error margin 610 part of the tuneable range of the fine tuning capacitive bank 310 will be superfluous and will not be used. As a result, the control signals/codes 352 that relate to the error margin 610 part of the tuneable range of the fine tuning capacitive network 305 will not be used, and effectively wasted.

As previously mentioned, the minimum frequency resolution of the DCO 130 dictates the phase noise performance of the DPLL 100, since it introduces quantization noise on top of the intrinsic DCO noise performance. The minimum DCO frequency resolution ($f_{res}$) is selectable during the design phase of the DPLL, and represents the DCO LSB (least significant bit) tuneable frequency step (i.e the fine tuning capacitive change step size ($\Delta C_{eq}$) However, by wasting control signals/codes 352 that relate to an error margin 610, and not using all of the tuneable range of the fine tuning capacitive bank 310 following calibration of the DCO 130, the smallest achievable DCO LSB tuneable frequency step is not being realized, and thus the minimum achievable frequency resolution of the DCO 130 is not being realized.

Furthermore, for frequency modulated continuous wave (FMCW) applications, a linear (smooth) transition is important between coarse tuning capacitive bank configurations. However, in the conventional technique illustrated in FIG. 6, even following calibration, misalignment of the fine tuning capacitive bank configurations can degrade the linearity of the transitions between the coarse tuning capacitive bank configurations.

Figure 7:
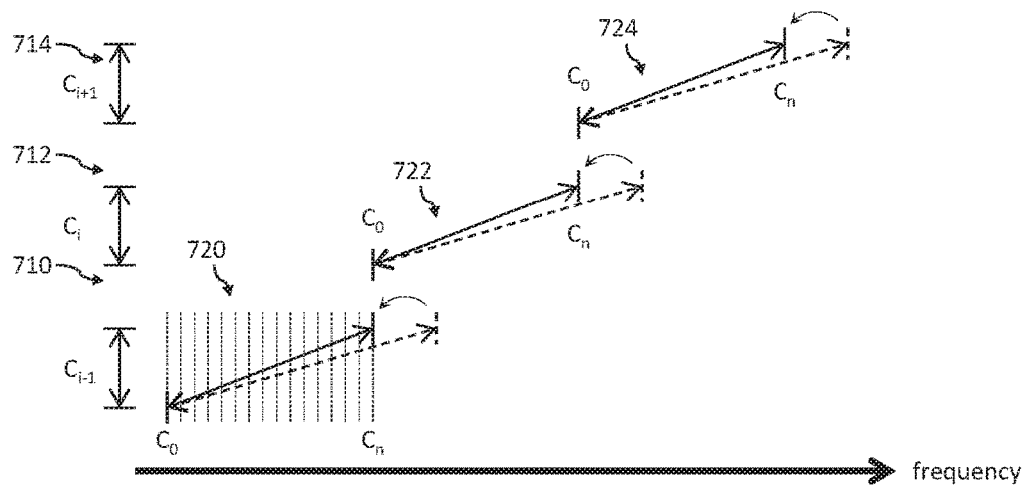
FIG. 7 illustrates a simplified example of a proposed technique for calibrating tuneable ranges of a fine tuning capacitance within a digitally controlled oscillator.

FIG. 7 illustrates a simplified example of a proposed technique for calibrating tuneable ranges of a fine tuning capacitance within a DCO. Three consecutive coarse tuning capacitive bank configurations are illustrated at $C_{i-1}$ 710, $C_i$ 712 and $C_{i+1}$ 714 respectively. The tuneable range of a fine tuning capacitance for each of the coarse tuning capacitive bank configurations $C_{i-1}$ 710, $C_i$ 712 and $C_{i+1}$ 714 is illustrated at 720, 722 and 724 respectively. During calibration of the DCO, it is proposed to calibrate, for each coarse tuning capacitive bank configurations $C_{i-1}$ 710, $C_i$ 712 and $C_{i+1}$ 714 for which a capacitively increased configuration of the coarse tuning capacitive component exists, the tuneable range of the fine tuning capacitance such that the tuneable ranges 720, 722 and 724 of the fine tuning capacitance for consecutive coarse tuning capacitive bank configurations are aligned.

Advantageously, such a calibration process allows PVT variations etc. to be compensated for without the need for relying on error margins that waste control signals/codes for the fine tuning capacitive component. In particular, following such a calibration process, the full tuneable range of the fine tuning capacitive component is be used, and no control signals/codes are wasted on error margins. Consequently, the smallest achievable DCO LSB tuneable frequency step can be realized, and thus the minimum achievable frequency resolution of the DCO can be realized. In this manner, the quantization noise introduced by the DCO may be minimized, thereby improving the phase noise performance of a DPLL of which the DCO forms a part. Furthermore, fine tuning capacitive component transitions can be aligned between consecutive coarse tuning capacitive bank configurations, thereby improving the linearity of the transitions between the coarse tuning capacitive bank configurations.

Figure 8:
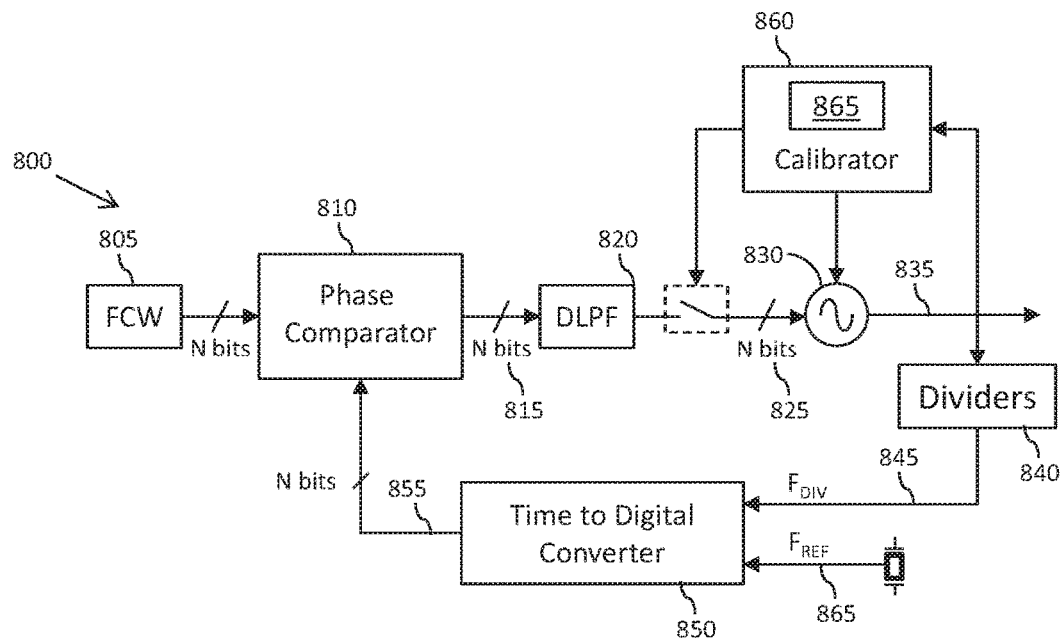
FIG. 8 illustrates a simplified block diagram of an example of a digital synthesizer.

FIG. 8 illustrates a simplified block diagram of an example of a digital synthesizer, and more specifically a digital phase locked loop (DPLL) 800. An N-bit digital frequency control word 805 is provided to a phase comparator 810, which compares an N-bit digital feedback signal 855 to the frequency control word 805, and outputs an N-bit oscillator control signal 815 based on the comparison of the digital feedback signal 855 to the frequency control word 805. A digital low pass filter 820 filters the oscillator control signal 815, and outputs a filtered N-bit oscillator control signal 825, which is provided to a digitally controlled oscillator (DCO) 830. The DCO 830 outputs a frequency signal 835 based on the filtered oscillator control signal 825. A feedback path of the DPLL 800 consists of a divider 840 that divides the output frequency signal 835 to generate a frequency-divided signal 845, which is provided to a time to digital converter 850. The time to digital converter 850 also receives a reference frequency signal 865 used to sample the frequency-divided signal 845. The time to digital converter 850 outputs the digital feedback signal 855 based on the sampling of the frequency-divided signal 845.

The digital synthesizer (DPLL) 800 of FIG. 8 further includes a calibration component 860 arranged to perform calibration of the DCO 830. Specifically, and as described in greater detail below, during a calibration mode of the digital synthesizer 800 the calibration component 860 is arranged to perform the steps of:
(i) configuring a fine tuning capacitive component of the DCO 830 into a minimum capacitance configuration therefor;
(ii) configuring a coarse tuning capacitive component of the DCO 830 into a first configuration $C_i$ therefor;
(iii) determining a resulting first output frequency $f_{i,0}$ of the DCO 830;
(iv) configuring the coarse tuning capacitive component into a second configuration $C_{i-1}$ therefor, the second and first configurations of the coarse tuning capacitive component being capacitively increasing consecutive configurations respectively;
(v) configuring the fine tuning capacitive component into a maximum capacitance configuration $C_n$ therefor;
(vi) determining control signal settings for a resolution adjustment component of the DCO 830 that achieve a resulting output frequency $f_{i-1,n}$ of the DCO 830 equal to the determined first output frequency $f_{i,0}$; and
(vii) generating calibration data for the second configuration $C_{i-1}$ of the coarse tuning capacitive component comprising the determined control signal settings for the resolution adjustment component.

Figure 9:
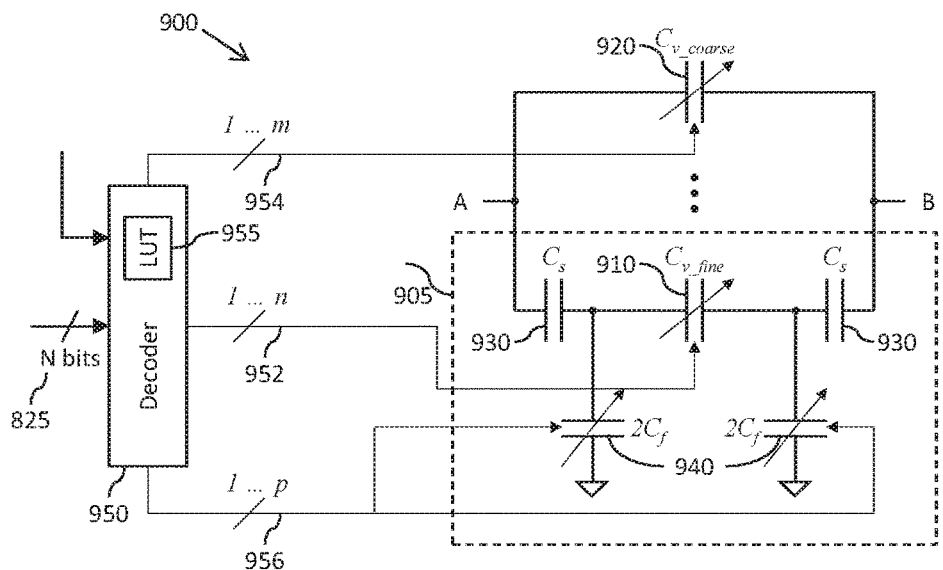
FIG. 9 illustrates a simplified circuit diagram of a digitally controlled variable capacitance component of a digitally controlled oscillator.

FIG. 9 illustrates a simplified circuit diagram of a digitally controlled variable capacitance component 900 of the DCO 830. The variable capacitance component 900 of the DCO 830 includes a fine tuning capacitive component 910, illustrated generally as a variable capacitance in FIG. 9, coupled between tank nodes A and B of the DCO 830. In some examples, the fine tuning capacitive component 910 may consist of a capacitive bank made up of a plurality of capacitive elements (not illustrated) coupled in parallel and individually controllable in a binary manner, by way of digital control signals 952, such that each capacitive element provides a first capacitive value when the respective control signal 952 is set to a first logical level (e.g. '0') and a second capacitive value when the respective control signal 952 is set to a second logical level (e.g. '1'). Each capacitive element may be implemented by way of, for example, a capacitor coupled in series with a switch (e.g. transistor) device, a varactor diode, a switched varactor or the like. In some examples, the capacitive elements of the fine tuning capacitive component 910 are matched such that they each provide substantially the same first and second capacitive values, with the difference between the first and second capacitive values of the individual capacitive elements defining the capacitive change step size ($\Delta C_v$) for the fine tuning capacitive component 910.

The fine tuning capacitive component 910 is coupled in series with two series capacitances $C_s$ 930. The fine tuning capacitive component 910 is further coupled on either side thereof to a reference voltage (ground in the illustrated implementation) by two shunt capacitances $2C_f$ 940. The fine tuning capacitive component 910, series capacitances $C_s$ 930 and shunt capacitances $2C_f$ 940 together form a fine tuning capacitive network 905 of the variable capacitance component 900.

The variable capacitance component 900 of the DCO 830 includes a coarse tuning capacitive component 920, illustrated generally as a variable capacitance in FIG. 9, coupled between tank nodes A and B. In some examples, the coarse tuning capacitive component 910 may consist of one or more capacitive bank(s), such as described above in relation to the fine tuning capacitive component 910, and controllable by way of control signals 954.

The variable capacitance component 900 of the DCO 830 further includes a resolution adjustment component, controllable to adjust a tuneable range of the fine tuning capacitive network 905. In the example illustrated in FIG. 9, the resolution adjustment component is implemented by way of the two shunt capacitances $2C_f$ 940 being variable capacitance components having variable capacitances controllable by way of control signals 956.

As mentioned above, it is proposed to calibrate the tuneable range of the fine tuning capacitance of the variable capacitance component 900 such that the tuneable range of the fine tuning capacitance for consecutive coarse tuning configurations are aligned. Such an alignment may be expressed as:

$$\Delta C_{eq} = C_{eq\_max} - C_{eq\_min} = C_{coarse\_step} \quad \text{Equation 3}$$

where $C_{eq}$ is the equivalent capacitance of the fine tuning capacitive network 905, $\Delta C_{eq}$ is the tuneable range of the fine tuning capacitive network 905, $C_{eq\_max}$ is the maximum tuneable capacitive value of the fine tuning capacitive network 905, $C_{eq\_min}$ is the minimum tuneable capacitive value of the fine tuning capacitive network 905 and $C_{coarse\_step}$ is a single capacitive change step size for the coarse tuning capacitive component 920.

The equivalent capacitance $C_{eq}$ of the fine tuning capacitive network 905 may be expressed as:

$$C_{eq} = \frac{C_s(C_v + C_f)}{2(C_v + C_f) + C_s} \quad \text{Equation 4}$$

From Equation 4 we get:

$$C_{eq\_max} = \frac{C_s(C_{v\_max} + C_f)}{2(C_{v\_max} + C_f) + C_s} = \frac{C_s(n * \Delta C_v + C_f)}{2(n * \Delta C_v + C_f) + C_s} \quad \text{Equation 5}$$

$$C_{eq\_min} = \frac{C_s(C_{v\_min} + C_f)}{2(C_{v\_min} + C_f) + C_s} = \frac{C_s(\Delta C_v + C_f)}{2(\Delta C_v + C_f) + C_s} \quad \text{Equation 6}$$

where it is assumed that the fine tuning capacitance component 910 is tuneable between a single capacitive change step value ($\Delta C_v$) and n capacitive change step sizes. Substituting Equations 5 and 6 into Equation 3 gives:

$$\frac{C_s(n * \Delta C_v + C_f)}{2(n * \Delta C_v + C_f) + C_s} - \frac{C_s(\Delta C_v + C_f)}{2(\Delta C_v + C_f) + C_s} = C_{coarse\_step} \quad \text{Equation 7}$$

In some examples, the individual capacitive elements used within the tuning capacitance component 910 may match (i.e. provide substantially the same first and second capacitive values as) the capacitive elements within the coarse tuning capacitive component 920 that define the single capacitive change step size $C_{coarse\_step}$ for the coarse tuning capacitive component 920. In such a scenario: $C_{coarse\_step} = \Delta C_v = C_{unit}$. Equation 7 may be re-written to be expressed in terms of the shunt capacitance value $C_f$:

$$C_f = \frac{-(C_{unit} + n.C_{unit}) + \sqrt{(C_{unit} + n.C_{unit} + C_s) + C_s^2(n-2) - 2C_{unit}(2nC_{unit} + C_s + nC_s)}}{2} \quad \text{Equation 8}$$

From Equation 8, it can be seen that alignment of the tuneable range of the fine tuning capacitive network 905 to a single capacitive change step size $C_{unit}$ for the coarse tuning capacitive component 920 may be achieved by proper setting of the shunt capacitance value $C_f$.

In the example illustrated in FIG. 9, a decoder 950 is arranged to receive and decode the N-bit oscillator control signal 825, and to output n+m control signals 952, 954 to the capacitive components 910, 920 in accordance with the decoded N-bit oscillator control signal 825; n of the control signals 952 controlling capacitive elements (not illustrated) within the fine tuning capacitive component 910; and m of the control signal 954 controlling capacitive elements (not illustrated) within the coarse tuning capacitive component 920. In the example illustrated in FIG. 9, the decoder 950 is further arranged to output the controls signals 956 for the resolution adjustment component consisting of the two shunt capacitances $2C_f$ 940. In the illustrated example, the decoder 950 is arranged to decode the N-bit oscillator control signal 825 using a lookup table 955, the lookup table 955 containing control settings for the control signals 952, 954, 956 associated with digital control codes defined by the N-bit oscillator control signal 825.

Figure 10:
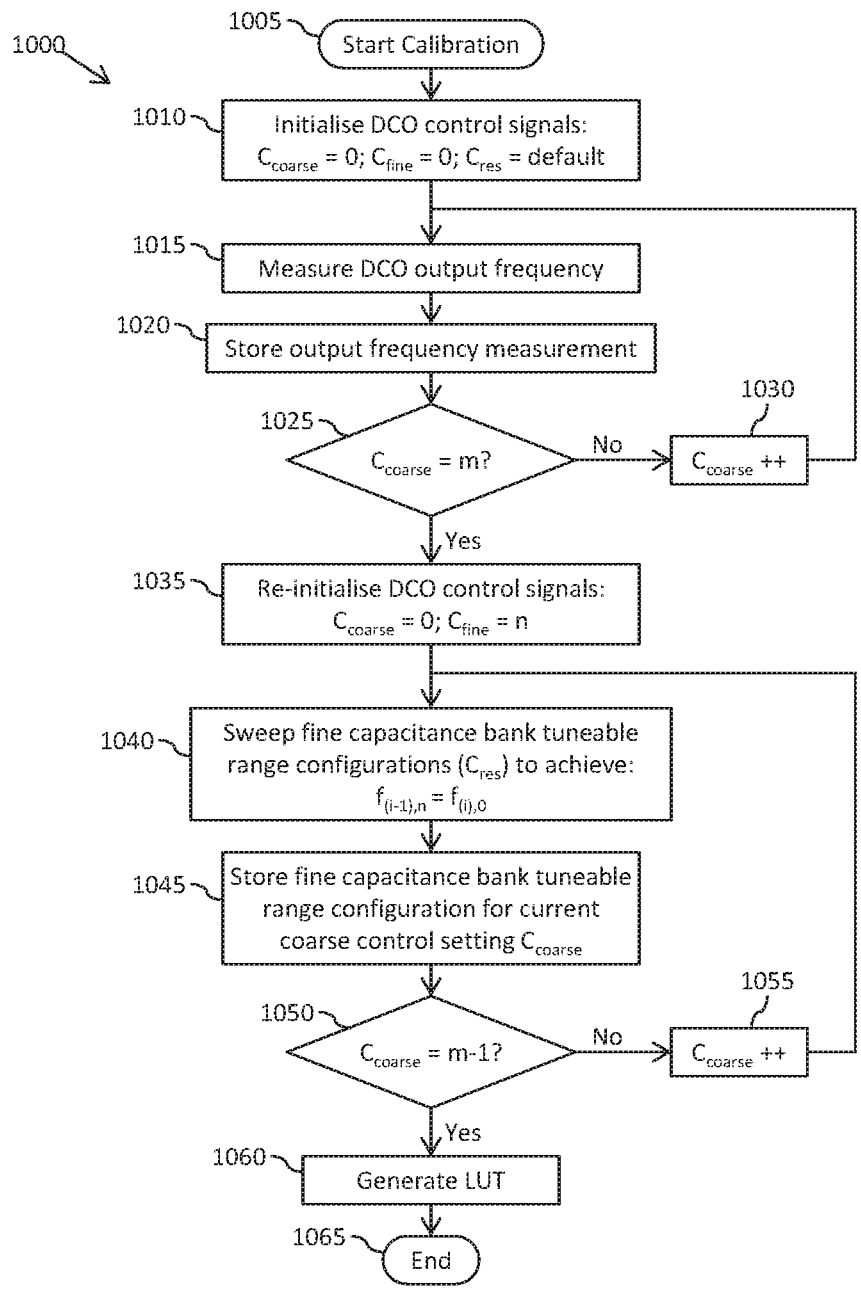
FIG. 10 illustrates a simplified flowchart of an example of a method of calibrating a digitally controlled oscillator.

Referring now to FIG. 10, there is illustrated a simplified flowchart 1000 of an example of a method of calibrating a digitally controlled oscillator, for example as may be implemented within the calibration component 860 of the DPLL 800 illustrated in FIG. 8 for calibrating the DCO 830. The method starts at 1005 and moves on to 1010 where DCO control signals (for example the control signals 952, 954, 956 illustrated in FIG. 9) are initialised, which for the illustrated example consists of setting the control signals to configure the fine tuning capacitive component 910 and coarse tuning capacitive component 920 into a minimum capacitance configuration, and configuring the resolution adjustment component into a default (e.g. centred) capacitance configuration. For example, and as illustrated in FIG. 8, the calibration component 860 may be arranged to decouple the DCO 830 from the oscillator control signal 825 output by the low pass filter 820, and to cause the decoder 950 to configure the respective settings for the control signals 952, 954, 956.

Referring back to FIG. 10, the resulting output frequency of the DCO 830 is then measured, or otherwise determined at 1015, and the measured output frequency is stored along with the DCO control signal settings at 1020. For example, and as illustrated in FIG. 8, the calibration component 860 may be arranged to receive the output signal from the DCO 830 and to measure or otherwise determine the frequency of the received DCO output signal. The measured output frequency and corresponding DCO control signal settings are then stored within a memory element 865 of the calibration component 860.

Referring back to FIG. 10, it is then determined whether the coarse tuning capacitive component 920 of the DCO 830 is configured into a maximum capacitive configuration ($C_{coarse}$=m), at 1025. If the coarse tuning capacitive component 920 of the DCO 830 is not configured into a maximum capacitive configuration, the control signals 954 for the coarse tuning capacitive component 920 are reset to configure the coarse tuning capacitive component 920 into the next capacitively increasing consecutive configuration therefor, at 1030. The method then loops back to 1015, where the resulting output frequency of the DCO 830 is measured, or otherwise determined, and the measured output frequency is stored along with the respective DCO control signal settings at 1020. In this manner, the method loops until output frequency measurements have been obtained and stored for all configurations of the coarse tuning capacitive component 920 with the fine tuning capacitive component 910 configured into a minimum capacitance configuration.

Figure 11:
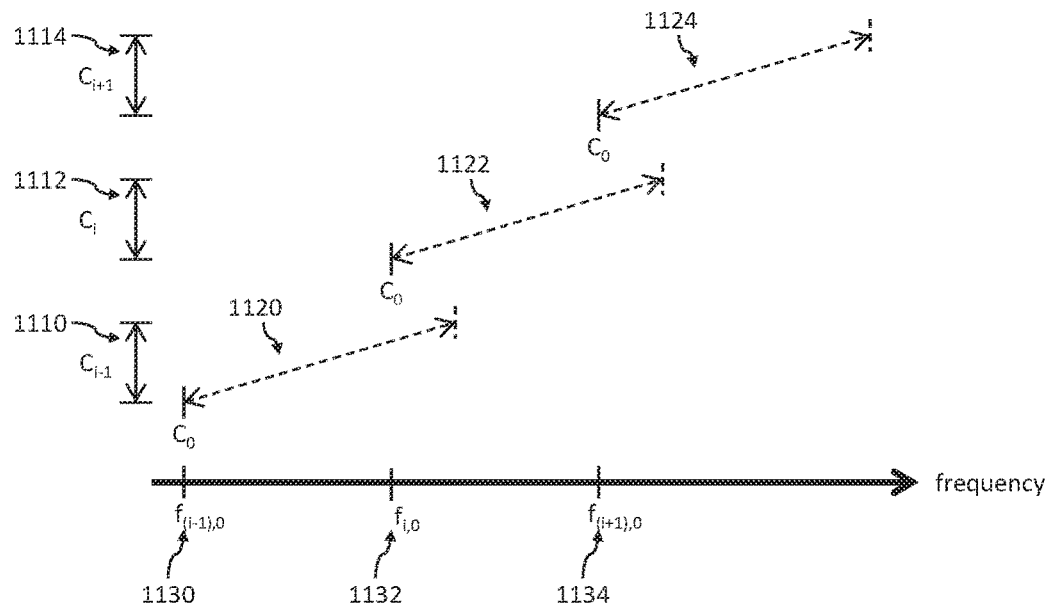
FIG. 11 illustrates an example of configuration data obtained within a first part of the method of FIG. 10.

FIG. 11 illustrates an example of the configuration data obtained and stored within this first part of the method of FIG. 10. As illustrated in FIG. 11, for each configuration of the coarse tuning capacitive component 920, such as the three consecutive coarse tuning capacitive bank configurations are illustrated at $C_{i-1}$ 1110, $C_i$ 1112 and $C_{i+1}$ 1114, a respective output frequency measurement $f_{(i-1),0}$ 1130, $f_{i,0}$ 1132 and $f_{(i+1),0}$ 1134 the fine tuning capacitive component 910 configured into a minimum capacitance configuration $C_0$ at the lower ends of the respective tuneable ranges 1120, 1122 and 1124 of the fine tuning capacitive network 905.

Referring back to FIG. 10, once it is determined that the coarse tuning capacitive component 920 of the DCO 830 is configured into a maximum capacitive configuration ($C_{coarse}$=m), at 1025, the method moves on to 1035 where the DCO control signals are re-initialised to configure the fine tuning capacitive component 910 into a maximum capacitance configuration therefor, the coarse tuning capacitive component 920 into a minimum capacitance configuration therefor. The method then moves on to 1040 where control signal settings for the resolution adjustment component of the DCO 830 (i.e. for control signals 956 in FIG. 9) that achieve a resulting output frequency of the DCO 830 for the current configuration of the coarse tuning capacitive component 920 with the fine tuning capacitive component 910 configured into a maximum capacitance configuration therefor that is equal to a stored output frequency value for a capacitively increasing consecutive configuration of the coarse tuning capacitive component 920 with the fine tuning capacitive component 910 configured into a maximum capacitance configuration therefor. For example, such a determination of the control signal settings for the resolution adjustment component of the DCO 830 may be obtained by way of 'sweeping' the control signal settings for the resolution adjustment component while measuring the output frequency until the 'target' output frequency is achieved.

The determined control signal settings for the resolution adjustment component of the DCO 830 are then stored along with the fine and coarse tuning capacitive component control signal settings and respective output frequency at 1045. It is then determined whether the coarse tuning capacitive component 920 of the DCO 830 is configured into a one-from-maximum capacitive configuration ($C_{coarse}$=m−1), at 1050. If the coarse tuning capacitive component 920 of the DCO 830 is not configured into a one-from-maximum capacitive configuration, the control signals 954 for the coarse tuning capacitive component 920 are reset to configure the coarse tuning capacitive component 920 into the next capacitively increasing consecutive configuration therefor, at 1055. The method then loops back to 1040, where control signal settings for the resolution adjustment component of the DCO 830 (i.e. for control signals 956 in FIG. 9) for the current configuration of the coarse tuning capacitive component 920 are determined. In this manner, the method loops until control signal settings for the resolution adjustment component for all configurations (but the absolute maximum capacitive configuration) of the coarse tuning capacitive component 920 are determined and stored.

Figure 12:
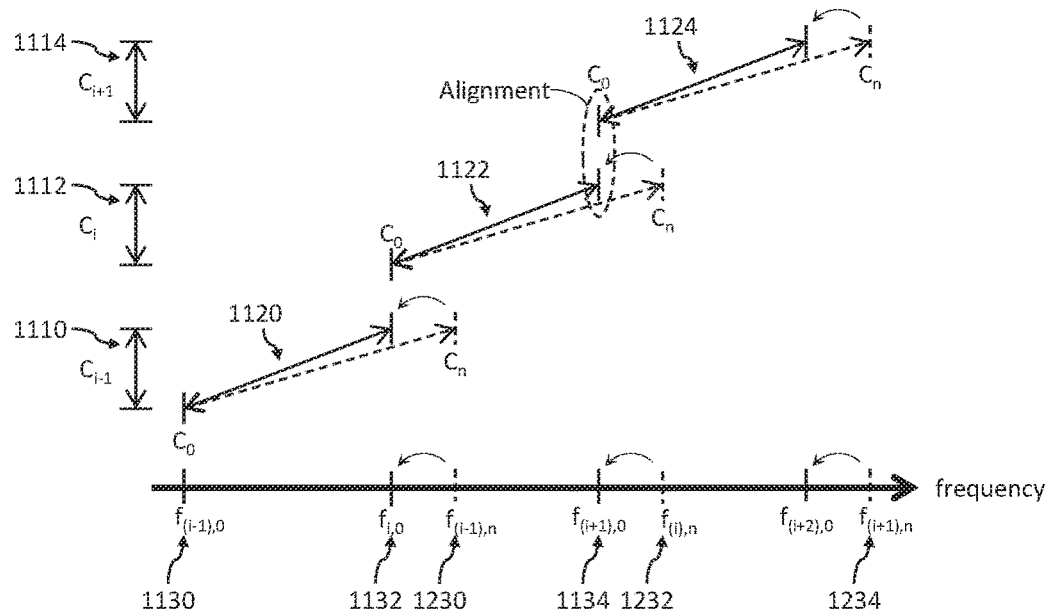
FIG. 12 illustrates an example of configuration data obtained within a second part of the method of FIG. 10.

FIG. 12 illustrates an example of the configuration data obtained and stored within this second part of the method of FIG. 10. Taking the coarse capacitive component configuration $C_i$ 1112 as an example, with the fine tuning capacitive component 910 configured into a maximum capacitance configuration $C_n$ at the higher end of the respective tuneable range 1122 of the fine tuning capacitive network 905, the control signal settings for the resolution adjustment component of the DCO 830 are 'swept' to find the control signal settings that cause the output frequency $f_{i,n}$ for the current coarse and fine capacitive tuning configurations to be equal to the stored output frequency $f_{(i+1),0}$ for the capacitively increasing consecutive configuration $C_{i+1}$ of the coarse tuning capacitive component 920 with the fine tuning capacitive component 910 configured into a maximum capacitance configuration $C_0$. In this manner, the tuneable range 1122 of the fine tuning capacitive network 905 for the coarse capacitive component configuration $C_i$ 1112 is adjusted (by way of the control signal settings for the resolution adjustment component) to be aligned with the tuneable range 1124 of the fine tuning capacitive network 905 for the next consecutive coarse capacitive component configuration $C_{i+1}$ 1114.

By dynamically and individually adjusting the respective tuneable range of the fine tuning capacitive network 905 for each coarse tuning configuration in this manner, variations in PVT etc. can be compensated for to ensure accurate alignment of the tuneable range of the fine tuning capacitive network 905 between coarse tuning configurations, without wasting control signals/codes for the fine tuning capacitive component 910. As a result, the smallest achievable DCO LSB tuneable frequency step can be realized, and thus the minimum achievable frequency resolution of the DCO can be realized. In this manner, the quantization noise introduced by the DCO may be minimized, thereby improving the phase noise performance of a DPLL of which the DCO forms a part. Furthermore, fine tuning capacitive component transitions can be aligned between consecutive coarse tuning capacitive bank configurations, thereby improving the linearity of the transitions between the coarse tuning capacitive bank configurations.

Figures 13, 14, 15:
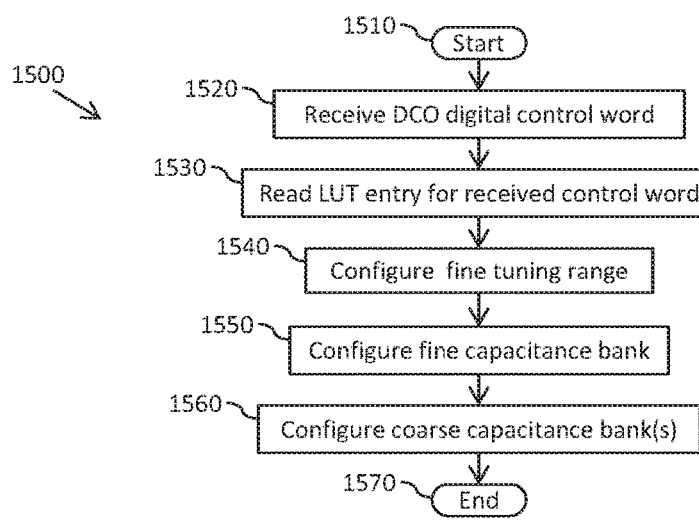
FIG. 13 illustrates an example of the configuration data obtained and stored within the method of FIG. 10.
FIG. 14 illustrates an example of a template for a lookup table that is generated from the configuration data in FIG. 13.
FIG. 15 illustrates a simplified flowchart of an example of a method of decoding a digital control word for controlling a digitally controlled oscillator.

Referring back to FIG. 10, once it is determined that the coarse tuning capacitive component 920 of the DCO 830 is configured into a one-from-maximum capacitive configuration ($C_{coarse}$=m), at 1050, the method moves on to 1060 where calibration data for the DCO 830 is generated and stored, which in the example illustrated in FIG. 10 consists of generating the lookup table 955 for the decoder 950. For example, FIG. 13 illustrates an example of the configuration data 1300 obtained and stored previously within the method of FIG. 10. The data indicated at 1310 consists of the configuration data obtained and stored within the first part of the method of FIG. 10 (1010-1030), whilst the data indicated at 1320 consists of the configuration data obtained and stored within the second part of the method of FIG. 10 (1035-1055). In the example illustrated in FIG. 13, the previously obtained data consists of control signal settings 1330 for the coarse capacitive tuning component 920, control signal settings 1340 for the fine capacitive tuning component 910, control signal settings 1350 for the resolution adjustment component of the DCO 830 and a respective output frequency 1360 of the DCO 830.

FIG. 14 illustrates an example of a template for the lookup table 955 that is generated from the configuration data 1300 in FIG. 13. A first column contains the digital control words for controlling/tuning the DCO 830. Each digital control word 1410 is directly mapped to specific control signal settings 1420, 1430 for the fine and coarse tuning capacitive components 910, 920 of the DCO 830 respectively.

The resolution adjustment control signal settings 1440 are defined by the configuration data indicated 1320 for the respective coarse capacitance component control signal settings 1430 obtained and stored during the second part of the method of FIG. 10. The resulting output frequencies 1450 for the DCO 830 for the maximum and minimum fine tuning capacitive component configurations $C_0$, $C_n$ for each coarse tuning capacitive component configuration $C_i$ are defined within the previously obtained configuration data 1300. The resulting output frequencies for the DCO 830 for the intermediate fine tuning capacitive component configurations ($C_1$ to $C_{(n-1)}$) for each coarse tuning capacitive component configuration $C_i$ may be determined by way of, for example, interpolation based on the output frequencies 1450 for the maximum and minimum fine tuning capacitive component configurations $C_0$, $C_n$, or by actually measuring the individual output frequencies 1450 for the DCO 830 for each individual control signal configuration.

Referring now to FIG. 15, there is illustrated a simplified flowchart 1500 of an example of a method of decoding a digital control word for controlling a digitally controlled oscillator, such as may be implemented within the decoder 950 of the DCO 830 illustrated in FIG. 9. The method starts at 1510, and moves on to 1502 where a digital control word, for example the N-bit oscillator control signal 825 illustrated in FIGS. 8 and 9, for controlling a digitally controlled oscillator 830 is received. Control signal settings corresponding to the received digital control word are then determined at 1530, which in the illustrated example consists of reading a lookup table for the received control word. The determined control signal settings consist of:

control signal settings for a first set of control signals for configuring a coarse tuning capacitive component (e.g. the control signals 954 for the coarse tuning capacitive component 920 of FIG. 9);

control signal settings for a second set of control signals for configuring a fine tuning capacitive component (e.g. the control signals 952 for the fine tuning capacitive component 910 of FIG. 9); and control signal settings for a third set of control signals for configuring resolution adjustment component (e.g. the control signals 956 for the variable shunt capacitive components 940 of FIG. 9).

Having determined the control signal settings corresponding to the received digital control word, the determined control signal settings are then applied to the respective control signals to configure the variable capacitance component of the DCO, which in the illustrated example consists of applying the third set of control signals to configure the resolution adjustment component at 1540 to configure the fine tuning range for the DCO, applying the second set of control signals at 1550 to configure the fine capacitive component, and applying the first set of control signals at 1560 to configure the coarse capacitive component. The method then ends at 1570.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

Furthermore, because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms 'assert' or 'set' and 'negate' (or 'de-assert' or 'clear') are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A method of calibrating a digitally controlled oscillator, (DCO) the method comprising:
    configuring a fine tuning capacitive component of the DCO into a minimum capacitance configuration $C_0$ therefor;
    configuring a coarse tuning capacitive component of the DCO into a first configuration $C_i$ therefor;
    determining a resulting first output frequency $f_{i,0}$ of the DCO;
    configuring the coarse tuning capacitive component into a second configuration $C_{i-1}$ therefor, wherein the second and first configurations of the coarse tuning capacitive component are capacitively increasing consecutive configurations respectively;
    configuring the fine tuning capacitive component into a maximum capacitance configuration $C_n$ therefor;
    determining control signal settings for a resolution adjustment component of the DCO that achieve a resulting output frequency $f_{i-1,n}$ of the DCO equal to the determined first output frequency $f_{i,0}$; and
    generating calibration data for the second configuration $C_{i-1}$ of the coarse tuning capacitive component, wherein the calibration data comprises the determined control signal settings for the resolution adjustment component.

2. The method of claim 1, wherein the method comprises:
    configuring the fine tuning capacitive component into the minimum capacitance configuration $C_0$ therefor;
    for each configuration $C_i$ of the coarse tuning capacitive component determining a resulting first output frequency $f_{i,0}$ of the DCO with the fine tuning capacitive component configured in the minimum capacitance configuration $C_0$ therefor;
    configuring the fine tuning capacitive component into a maximum capacitance configuration $C_n$ therefor;
    for each configuration $C_{i-1}$ of the coarse tuning capacitive component for which a capacitively increased configuration of the coarse tuning capacitive component exists, determining control signal settings for the resolution adjustment component that achieve a resulting output frequency $f_{i-1,n}$ of the DCO equal to the determined first output frequency $f_{i,0}$ for the capacitively increased consecutive configuration $C_i$ of the coarse tuning capacitive component; and
    generating calibration data for each configuration $C_{i-1}$ of the coarse tuning capacitive component for which a capacitively increased configuration of the coarse tuning capacitive component exists comprising the determined control signal settings for the resolution adjustment component.

3. The method of claim 1 further comprising:
determining control signal settings for a first and a second variable capacitive component of the resolution adjustment component that achieve a resulting output frequency fi−1,n of the DCO equal to the determined first output frequency fi,0, wherein the resolution adjustment component comprises
  the first variable capacitive component coupled between a first terminal of the fine tuning capacitive bank and a reference voltage, and
  the second variable capacitive component coupled between a second terminal of the fine tuning capacitive bank and the reference voltage.

4. The method of claim 1 further comprising storing the generated calibration data within a lookup table accessible by a decoder of the DCO.

5. A digital synthesizer comprising a digitally controlled oscillator (DCO), the DCO comprising:
  a fine tuning capacitive component;
  a coarse tuning capacitive component;
  a resolution adjustment component; and
  a calibration component arranged to calibrate the DCO, wherein said calibration comprises
    configuring the fine tuning capacitive component of the DCO into a minimum capacitance configuration $C_0$ therefor,
    configuring the coarse tuning capacitive component of the DCO into a first configuration $C_i$ therefor,
    determining a resulting first output frequency $f_{i,0}$ of the DCO,
    configuring the coarse tuning capacitive component into a second configuration $C_{i-1}$ therefor, wherein the second and first configurations of the coarse tuning capacitive component are capacitively increasing consecutive configurations respectively,
    configuring the fine tuning capacitive component into a maximum capacitance configuration $C_n$ therefor,
    determining control signal settings for the resolution adjustment component of the DCO that achieve a resulting output frequency $f_{i-1,n}$ of the DCO equal to the determined first output frequency $f_{i,0}$; and
    generating calibration data for the second configuration $C_{i-1}$ of the coarse tuning capacitive component, wherein the calibration data comprises the determined control signal settings for the resolution adjustment component.

6. The digital synthesizer of claim 5, wherein the calibration component is arranged to perform calibration of the DCO comprising:
  configuring the fine tuning capacitive component into the minimum capacitance configuration $C_0$ therefor;
  for each configuration $C_i$ of the coarse tuning capacitive component determining a resulting first output frequency $f_{i,0}$ of the DCO with the fine tuning capacitive component configured in the minimum capacitance configuration $C_0$ therefor;
  configuring the fine tuning capacitive component into a maximum capacitance configuration $C_n$ therefor;
  for each configuration $C_{i-1}$ of the coarse tuning capacitive component for which a capacitively increased consecutive configuration of the coarse tuning capacitive component exists, determining control signal settings for the resolution adjustment component that achieve a resulting output frequency $f_{i-1,n}$ of the DCO equal to the determined first output frequency $f_{i,0}$ for the capacitively increased consecutive configuration of the coarse tuning capacitive component; and
  generating calibration data for each configuration $C_{i-1}$ of the coarse tuning capacitive component for which a capacitively increased consecutive configuration of the coarse tuning capacitive component exists comprising the determined control signal settings for the resolution adjustment component.

7. The digital synthesizer of claim 5, wherein the resolution adjustment component comprises:
  a first variable capacitive component coupled between a first terminal of the fine tuning capacitive bank and a reference voltage; and
  a second variable capacitive component coupled between a second terminal of the fine tuning capacitive bank and the reference voltage, wherein the calibration component is arranged to perform calibration of the DCO further comprising determining control signal settings for the first and second variable capacitive components of the resolution adjustment component that achieve a resulting output frequency $f_{i-1,n}$ of the DCO equal to the determined first output frequency $f_{i,0}$.

8. The digital synthesizer of claim 5 wherein the DCO further comprises:
  a decoder; and
  a lookup table accessible by the decoder, wherein the calibration component is arranged to store the generated calibration data within the lookup table.

9. The digital synthesizer of claim 5, wherein the digital synthesizer comprises a digital phase locked loop.

10. A digitally controlled oscillator (DCO), comprising:
  a variable capacitance component coupled between a first node and a second node of the DCO, wherein the variable capacitance component comprises:
    a coarse tuning capacitive component coupled between the first and second nodes of the DCO and configurable between a plurality of coarsely stepped capacitive configurations,
    a fine tuning capacitive component coupled between the first and second nodes of the DCO and configurable between a plurality of finely stepped capacitive configurations, and
    a resolution adjustment component comprising a first variable capacitive component coupled between a first terminal of the fine tuning capacitive component and a reference voltage and a second variable capacitive component coupled between a second terminal of the fine tuning capacitive component and the reference voltage; and
  a decoder arranged to
    receive a digital control word,
    determine control signal settings corresponding to the received digital control word, wherein the control signal settings comprise control signal settings for a first set of control signals for configuring the coarse tuning capacitive component, control signal settings for a second set of control signals for configuring the fine tuning capacitive component, and control signal settings for a third set of control signals for configuring the variable capacitive components of the resolution adjustment component, and
    apply the determined control signal settings to the respective control signals to configure the variable capacitance component.

11. The DCO of claim 10, wherein the resolution adjustment component comprises:

a first variable capacitive component coupled between a first terminal of the fine tuning capacitive component and a reference voltage; and
a second variable capacitive component coupled between a second terminal of the fine tuning capacitive component and the reference voltage.

* * * * *